United States Patent
Dolazza et al.

(10) Patent No.: US 7,230,555 B2
(45) Date of Patent: Jun. 12, 2007

(54) SIGMA DELTA CONVERTER WITH FLYING CAPACITOR INPUT

(75) Inventors: Enrico Dolazza, Boston, MA (US); Hans Weedon, Salem, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 11/064,161

(22) Filed: Feb. 23, 2005

(65) Prior Publication Data
US 2006/0187097 A1    Aug. 24, 2006

(51) Int. Cl.
H03M 3/00   (2006.01)
(52) U.S. Cl. ............... 341/143; 341/155; 341/172
(58) Field of Classification Search ........... 341/143, 341/155, 172, 166
See application file for complete search history.

(56) References Cited

U.S. PATENT DOCUMENTS

| | | | | |
|---|---|---|---|---|
| 4,939,516 A | * | 7/1990 | Early | 341/143 |
| 5,068,660 A | * | 11/1991 | Swanson et al. | 341/143 |
| 5,142,286 A | * | 8/1992 | Ribner et al. | 341/143 |
| 5,227,795 A | * | 7/1993 | Yamakido et al. | 341/166 |
| 5,347,279 A | * | 9/1994 | Ishihara et al. | 341/166 |
| 5,659,314 A | * | 8/1997 | Tokura et al. | 341/143 |
| 5,724,037 A | * | 3/1998 | Lee | 341/143 |
| 5,754,131 A | * | 5/1998 | Ribner et al. | 341/143 |
| 6,157,329 A | * | 12/2000 | Lee et al. | 341/133 |
| 6,184,812 B1 | * | 2/2001 | Younis et al. | 341/143 |
| 6,411,232 B1 | * | 6/2002 | Miller et al. | 341/120 |

(Continued)

Primary Examiner—Jean Bruner Jeanglaude

(74) Attorney, Agent, or Firm—McDermott Will & Emery LLP

(57) ABSTRACT

A sigma delta analog to digital converter of the type adapted to be connected to a capacitive current input device, comprises: a sigma delta modulator having an input; and a flying capacitor constructed so as to be connected between the input of the sigma delta modulator and the capacitive current input device. In a preferred embodiment, the converter includes an input stage having an input coupled to the flying capacitor; a feedback path; a digital to analog converter (DAC) disposed in the feedback path and having a DAC output; and a DAC output capacitor and a second switch for alternately switching the DAC output capacitor between a first connection so as to transfer a signal from the output of the digital to analog converter to the DAC output capacitor and a second connection so as to transfer a signal from the DAC output capacitor to the input of the sigma delta modulator. The flying capacitor includes a charging capacitor and a flying capacitor switch, the flying capacitor being constructed so as to be alternately switched between a first connection so as to transfer a signal from the capacitive current input device to the charging capacitor and a second connection so as to transfer a signal from the charging capacitor to the input of the sigma delta modulator. The switching frequency of both switches is preferably operated at the same frequency $f_s$ so as to define a common switching cycle for both the flying capacitor switch and the second switch, and synchronized so that the flying capacitor switch and the second switch are each switched to the first connection during one phase of the switching cycle and switched to the second connection during a second phase of the switching cycle. The converter has particular utility for any device having capacitive current input devices, such as CAT scanner detectors and electret microphones. The disclosure also describes and claims a method of converting a current provided by a capacitive current input device to a digital signal using a sigma delta analog to digital converter.

18 Claims, 5 Drawing Sheets

U.S. PATENT DOCUMENTS

| | | | |
|---|---|---|---|
| 6,445,321 B2 * | 9/2002 | Huang | 341/143 |
| 6,657,571 B2 | 12/2003 | Gordon et al. | |
| 6,693,572 B1 * | 2/2004 | Oliaei et al. | 341/143 |
| 6,859,159 B2 * | 2/2005 | Michalski | 341/172 |

* cited by examiner

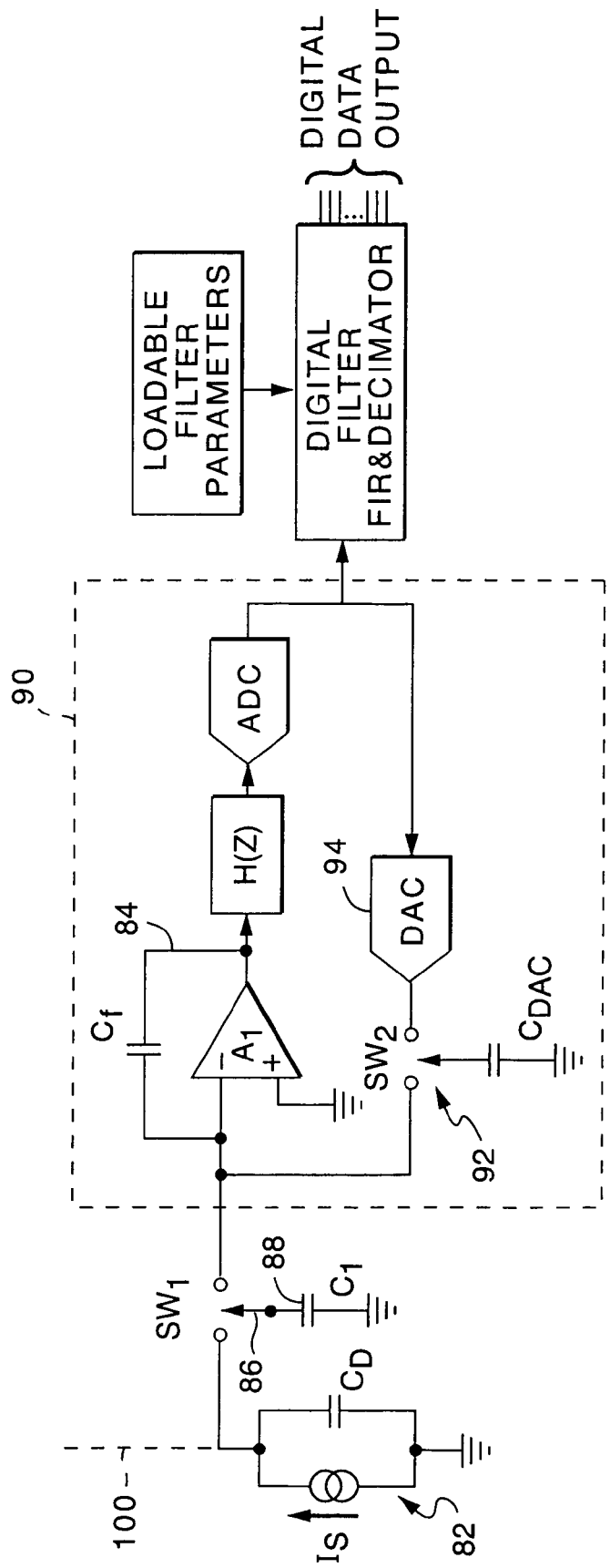
FIG. 6.1

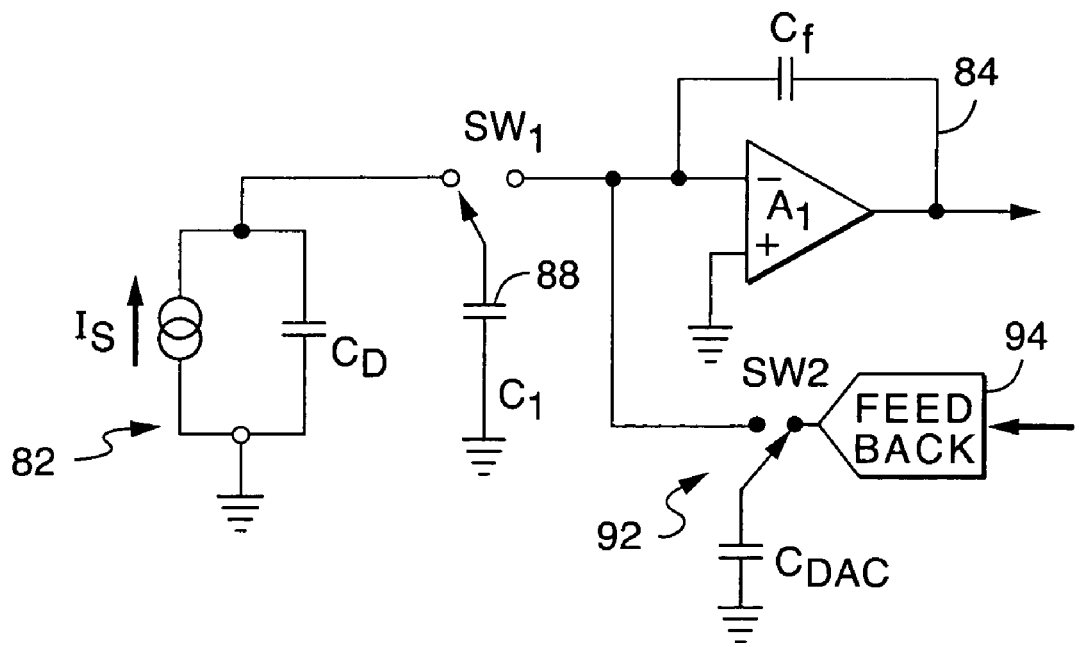
FIG. 6.2
PHASE α
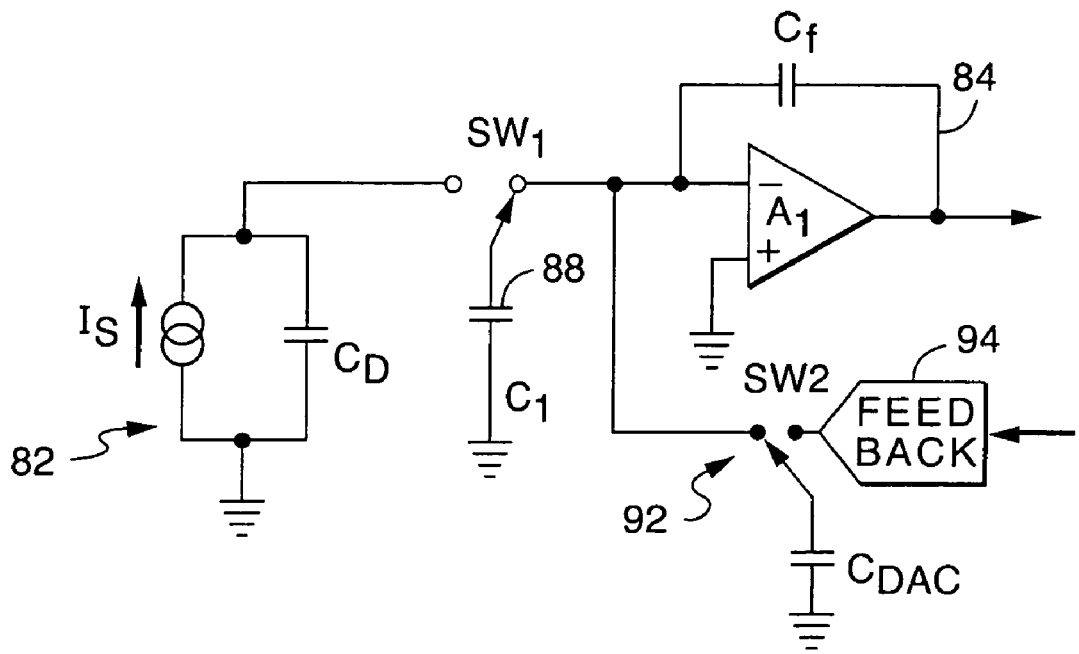
FIG. 6.3
PHASE β

SIGMA DELTA CONVERTER WITH FLYING CAPACITOR INPUT

FIELD

The disclosure relates generally to analog to digital (A/D) converters, and more particularly to Sigma Delta (ΣΔ) Analog-to-Digital (A/D) converters of the type having capacitive current inputs.

BACKGROUND

ΣΔ A/D converters with capacitive current inputs are converters that digitize the output current of devices having significant output capacitance to ground. The equivalent circuit of such capacitive current generating devices 12 is shown in FIG. 1. Examples of such devices include, but are not limited to, photodiodes like those used in x-ray detectors of CAT scanners (in which case the output capacitance may be of the order of 50 pF, including the layout capacitance) and electret microphones (normally referred to as electrostatic microphones).

In most cases, such devices have output voltage compliance limitations. Specifically, the voltages applied at their outputs should be kept within certain limits, although such a requirement becomes somewhat less stringent as the output current of such devices increases. For instance, zero-biased photodiodes used in CAT scanner detectors have typical output voltage compliance requirements of about 0±5 mV when the output current is around zero, and of about 0±25 mV when the output current is near full scale.

Various techniques of connecting the output of a capacitive current generator device to a ΣΔ A/D converter exist in prior art. Most, if not all, of them fall into one of the following three categories.

In a first connection category, an example of which is illustrated in FIG. 2, the output of the capacitive current generating device 22 is connected to an intermediate filter stage 24 that converts the analog input current to a voltage. The voltage signal is then sampled, held, and digitized by the ΣΔ converter 26. In this case, the converter 26 operates as a voltage input digitizer. This connection category is very frequently used in CAT scanner data acquisition systems (DAS), in which the intermediate filter stage 24 is most frequently implemented as a reset integrator, like that one shown in FIG. 2.

Whereas the type of connection illustrated in FIG. 2 can be designed to insure the voltage compliance requirements of the current generating device, it has substantial limitations: 1) the intermediate filter stage 24 adds circuitry complexity, and therefore adds cost power dissipation and reduces the overall reliability of the DAS channel; 2) the noise generated by the intermediate filter stage 24 must be kept very low; something that may be difficult when the output capacitance of the current source is significant as that of detector photodiodes; 3) the intermediate filter stage 24 pre-defines the frequency response of the converter output, thus eliminating the possibility of optimizing the frequency response of the DAS output for different applications and/or procedures.

In a second connection category, as illustrated in FIG. 3, the output of the capacitive current generating device 32 is connected to the input of the ΣΔ A/D converter 36 via an intermediate trans-impedance stage 34. This latter stage transforms the analog input current signal to an analog voltage signal. This analog voltage signal represents the input of the converter, which, also in this case, operates as a voltage input digitizer.

Like the first category of connection, this second one results in added circuit complexity, which means added costs and power dissipation as well as lower reliability of the DAS channels. The same considerations apply to the noise introduced by this intermediate stage 34. This second connection category, however, performs differently from the first one from two points of view: 1) the intermediate trans-impedance stage 34 does not pre-define the frequency response of the converter output of converter 36, which now can be optimized for the application by properly programming the digital filter/decimator of the ΣΔ converter 36; 2) the value of the resistor 38 in the trans-impedance stage 34 must be tuned to the value of the full scale input current to keep a reasonable stage gain so as to maintain voltage compliance requirements. Therefore, when different applications call for different values of the full scale input current, the stage 34 should feature selectable resistor values, thus further increasing the circuit complexity.

In a third category of connection, schematically illustrated in FIG. 4, the output of the capacitive current generating device 42 is coupled to the input of the ΣΔ A/D converter 44, the converter operating as a current input digitizer, converting the current input from capacitive current generating device 42 to a digitized value. U.S. Pat. No. 6,657,571, assigned to the present assignee, covers this type of connection in CAT scanner DAS applications.

The directly coupled input of the type shown in FIG. 4 removes all cost and noise disadvantages related to the introduction of an intermediate stage and, at the same time, insures the input voltage compliance requirements and preserves the possibility of optimizing the frequency response of the converter as a function of the application. Therefore, ΣΔ converters directly coupled to detector photodiodes (as illustrated in FIG. 4) provide an excellent solution for single or dual ring CAT scanner DAS's, which typically feature a number of channels of the order of 1000.

However, the type of connection shown in FIG. 4 presents limitations when power dissipation and operational speed requirements become severe. DAS's of multi-ring, high speed CAT scanners offer a pertinent example. Such scanners provide a dramatic increase in the number of channels (in excess of 50,000 for 64 rings), which in turn poses a stringent upper limit to the channel power dissipation, which for most applications should be kept substantially below 4 mW. However, such scanners, having higher rotational speeds, call for higher power of the X-ray tube, so that a sufficient x-ray flux is radiated in a shorter time. Higher x-ray flux, in turn, results in higher current per unit area of the photodiode that can reach hundreds of nanoamperes per square millimeter.

As illustrated in FIG. 5, the capacitive current generating device 52, having an output capacitance $C_D$, indicated as 54, is connected directly to the input of the ΣΔ modulator or converter 56. The converter 56 is shown as including the first integrator stage 58, also designated A1, comprising an integrating amplifier. As previously described, the inverting input of the integrating amplifier is directly coupled to the capacitive current generating device 52. Assume that the integrator stage 58 is implemented so that the integrating amplifier operates as a voltage output operational amplifier, having a gain-bandwidth product $f_0$ and a feedback capacitance $C_F$. The input impedance to ground of the voltage output operational amplifier of stage 58 is given, in first approximation, by the capacitance of $C_D$ in parallel with an equivalent resistor that has an approximate value of $\frac{1}{2}\pi f_0 C_F$. As a result, any time the DAC 68 of the $\Sigma\Delta$ converter feeds back a charge at the input of the first integrator stage, this input will settle with a time constant $\tau$ approximately equal to $C_D/2\pi f_0 C_F$. The DAC 68 of the converter feeds back a charge at the over-sampling frequency $f_S$, and therefore the first stage input must settle with very high precision, in the time $1/f_S$. In practice one can quantify the required precision stating that the time $1/f_S$ must be of the order of 10 times the constants $\tau$. As a result one can derive a first cut estimate of the required amplifier gain-bandwidth product as follows:

$$f_0 \approx 10 f_S C_D / 2\pi C_F \tag{1}$$

Returning to the example of a DAS for a multi-ring, high speed CAT scanner considered above, when the DAS is implemented with $\Sigma\Delta$ converters integrated in silicon, typical values of $C_F$ are of the order of few tenths of a picofarad; and the over-sampling frequency $f_S$ must be as high as several megahertz, to handle full-scale input currents like those considered above. As indicated above, typical values of $C_D$ are in the range of 50 pF. As a result, the gain-bandwidth product of the operational amplifier of the first integrator stage 58 should be of the order of several gigahertz. Operational amplifiers with such a high gain-bandwidth product are not economically feasible and, in any event, will dissipate power well in excess of the total power budget allocated to the entire channel, since the power dissipation of an operational amplifier is more than proportional to its gain-bandwidth product.

The present disclosure provides an approach for realizing the direct coupling of a capacitive current input device to a $\Sigma\Delta$ A/D converter that can be implemented with current IC mixed signal technologies and that meets all stated speed and power performance requirements.

SUMMARY

A sigma delta analog to digital converter of the type adapted to be connected a capacitive current input device, comprises a sigma delta modulator having an input; and a flying capacitor constructed to be connected between the input of the sigma delta modulator and the capacitive current input device. In a preferred embodiment, the converter includes an input stage having an input coupled to the flying capacitor; a feedback path; a digital to analog converter (DAC) disposed in the feedback path and having a DAC output; and a DAC output capacitor and a second switch for alternately switching the DAC output capacitor between a first connection so as to transfer a signal from the output of the digital to analog converter to the DAC output capacitor and a second connection so as to transfer a signal from the DAC output capacitor to the input of the sigma delta modulator. The flying capacitor includes a charging capacitor and a flying capacitor switch, the flying capacitor being constructed so as to be alternately switched between a first connection so as to transfer a signal from the capacitive current input device to the charging capacitor and a second connection so as to transfer a signal from the charging capacitor to the input of the sigma delta modulator. The switching frequency of both switches is preferably operated at the same frequency $f_s$ so as to define a common switching cycle for both the flying capacitor switch and the second switch, and synchronized so that the flying capacitor switch and the second switch are each simultaneously switched to the first connection during one phase of the switching cycle, and simultaneously switched to the second connection during a second phase of the switching cycle. The converter has particular utility for any device having capacitive current input devices, such as CAT scanner detectors and electret microphones. The disclosure also describes and claims a method of converting a current provided by a capacitive current input device to a digital signal using a sigma delta analog to digital converter.

Additional aspects and advantages of the present disclosure will become readily apparent to those skilled in this art from the following detailed description, wherein exemplary embodiments of the present disclosure are shown and described, simply by way of illustration of the best modes contemplated for carrying out the present disclosure. As will be realized, the present disclosure is capable of other and different embodiments and its several details are capable of modifications in various obvious respects, all without departing from the disclosure. Accordingly, the drawings and description are to be regarded as illustrative in nature, and not as restrictive.

GENERAL DESCRIPTION OF THE DRAWINGS

Reference is made to the attached drawings, wherein.

Figure 1:
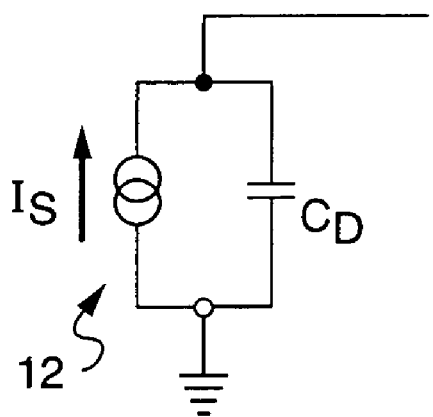
FIG. 1 is an equivalent circuit of a capacitive current generating device.
Figure 4:
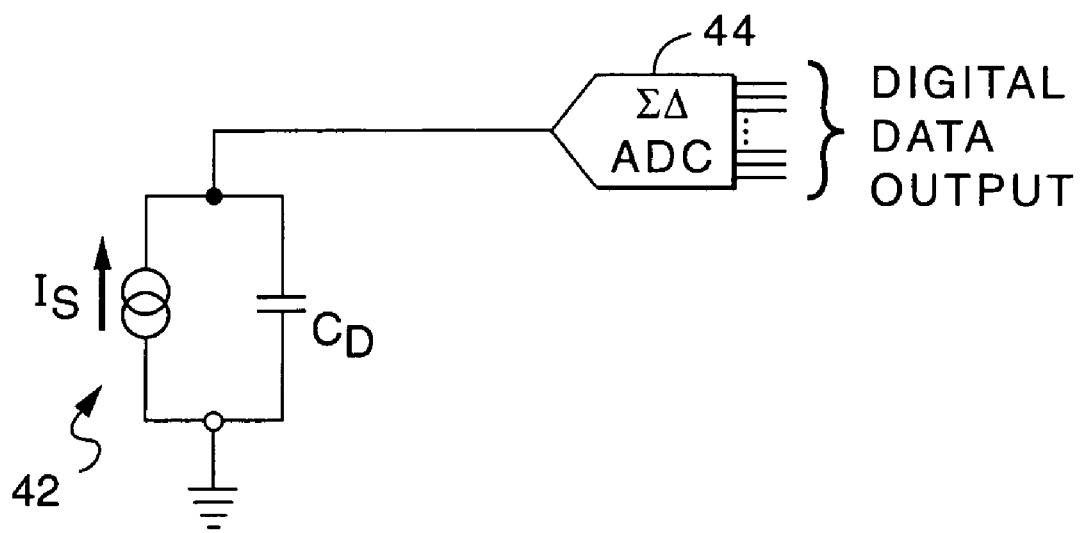
FIG. 4 is a circuit schematic illustrating a third category of prior art technique of connecting the output of a capacitive current generator device to a $\Sigma\Delta$ A/D converter.
Figure 2:
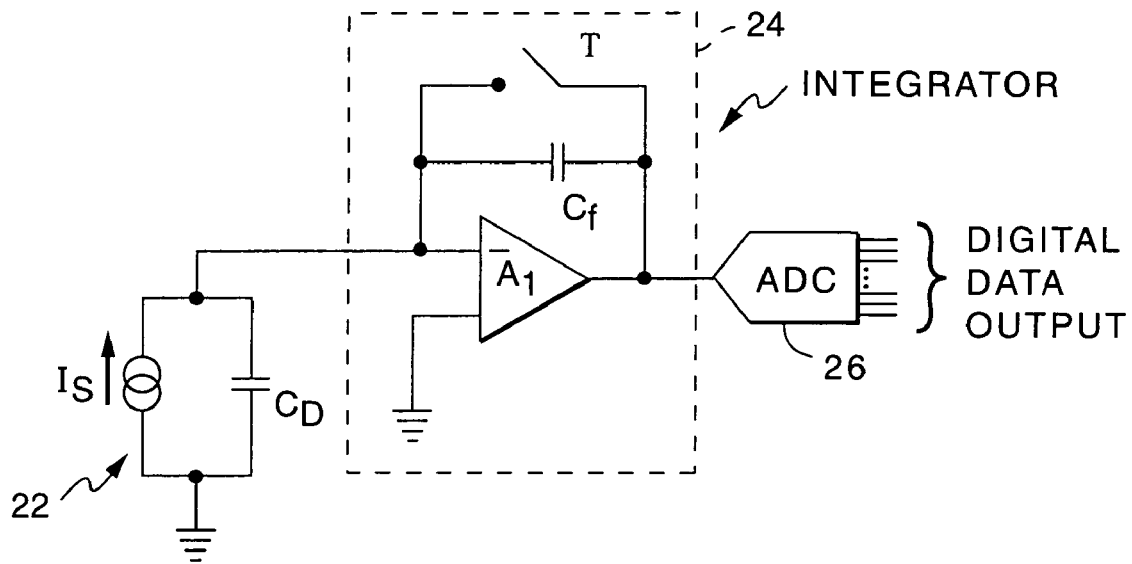
FIG. 2 is a circuit schematic illustrating a first category of prior art technique of connecting the output of a capacitive current generator device to a $\Sigma\Delta$ A/D converter.
Figure 3:
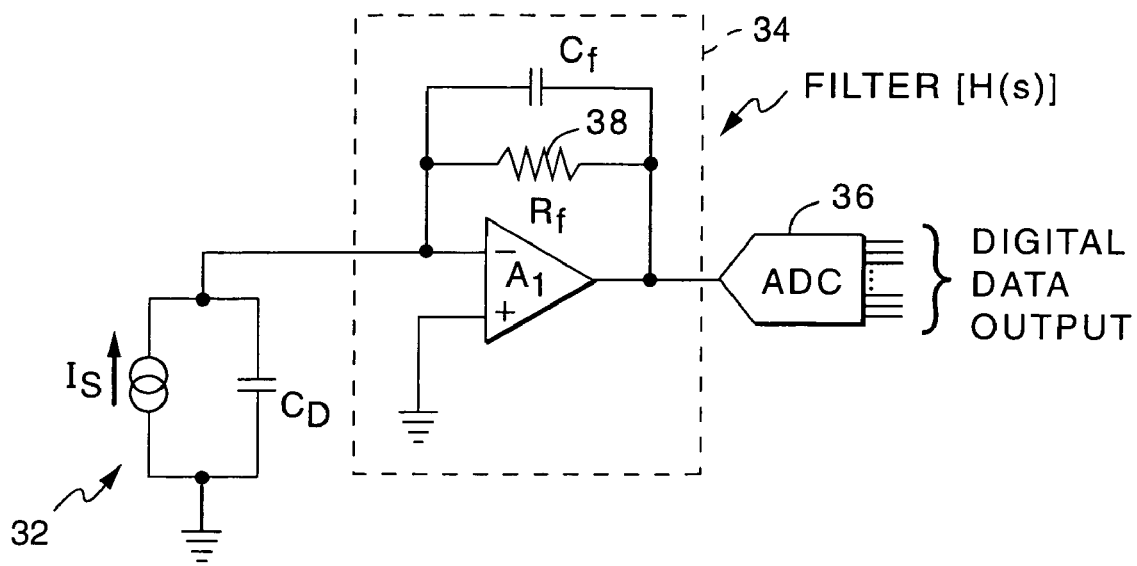
FIG. 3 is a circuit schematic illustrating a second category of prior art technique of connecting the output of a capacitive current generator device to a $\Sigma\Delta$ A/D converter.
Figure 5:
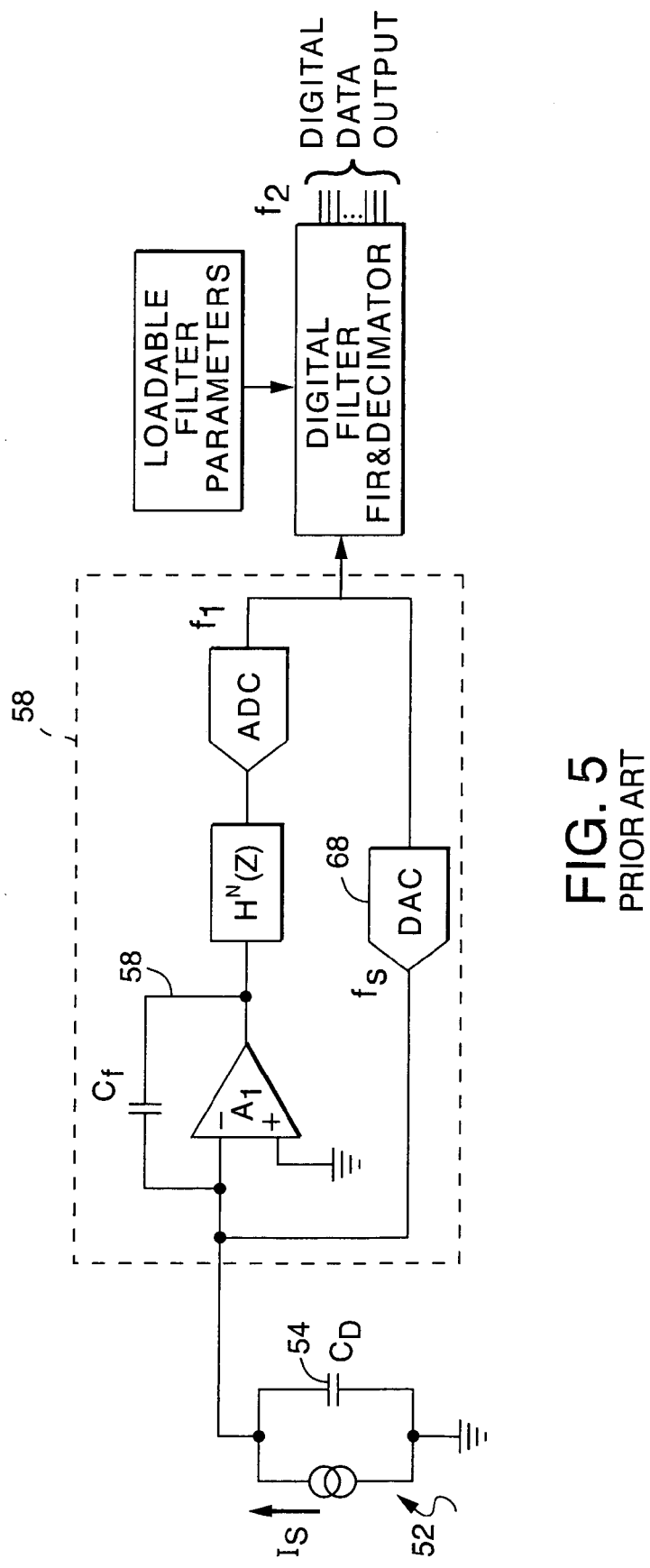

FIG. 5 is a circuit schematic illustrating a prior art $\Sigma\Delta$ converter of the type described in U.S. Pat. No. 6,657,571, and including a first integrator stage directly coupled to the capacitive current generating device having an output capacitance.

FIG. 6.1 is a circuit schematic illustrating a $\Sigma\Delta$ converter modified in accordance with teachings of the present disclosure.

FIG. 6.2 is a partial schematic illustrating one phase of operation of the $\Sigma\Delta$ converter of FIG. 6.1.

FIG. 6.3 is a partial schematic illustrating a second phase of operation of the $\Sigma\Delta$ converter of FIG. 6.1.

DETAILED DESCRIPTION OF THE DRAWINGS

According to the disclosure the input of the operational amplifier 84 of the first integrator stage of the $\Sigma\Delta$ A/D converter 90 is modified so as to further comprise a series flying or switching capacitor $C_I$ comprising the switch $SW_1$, indicated at 86, and the capacitor 88, connected so as to transfer charge from the capacitive current generating device 82 to the input of the amplifier 84 of the input stage. The capacitive output of the DAC 94 is designated as $C_{DAC}$ and for purposes of illustration is shown as a switching capacitor 92 having a switch $SW_2$. During each over-sampling cycle of duration $1/f_S$, the flying capacitor $C_I$ switches generally synchronously with the capacitor $C_{DAC}$ that feeds back a charge proportional to the output voltage of the DAC 94. In a preferred implementation, for a short part of the cycle time (phase $\alpha$) shown in FIG. 6.2, $C_I$ is connected to the capacitive current generating device 82, while $C_{DAC}$ is connected to the voltage output of the DAC; during all the remaining cycle time (phase $\beta$), both $C_I$ and $C_{DAC}$ are connected to the input of the operational amplifier 84. FIGS. 6.1, 6.2, and 6.3 show the input of the ΣΔ converter, modified according to this invention, and the configuration of $C_I$ and $C_{DAC}$ during the two phases of the cycle of the suggested timing.

The flying input capacitor $C_I$ provides a main benefit of buffering the input of the operational amplifier 84 of the first integrator stage from the output capacitance $C_D$ of the current generating device 82. In fact, the operational amplifier 84 sees at its input only the capacitive load of $C_I$ (ignoring other negligible capacitive loads like that of $C_{DAC}$) during its settling time, i.e. during phase β, whose duration can be a major fraction of the entire cycle time $1/f_0$. Therefore, equation (1) now can be rewritten as follows:

$$f_0^* \approx 10 f_S C_I / 2\pi C_F \qquad (2)$$

In general, $C_I$ can be made substantially smaller than $C_D$, without violating input voltage compliance requirements, and at the expense of an additional thermal noise term that can be shown to be negligible with respect to the KTC noise of the input stage. As a result, the new required value of the gain-bandwidth product, $f_0^*$, of the operational amplifier 84 of the first integrator stage is substantially lower than the value of originally stated, so that the amplifier can be implemented using current IC mixed signal technologies and its power dissipation will be reduced by an amount more than proportional to the ratio $C_D/C_I$.

Consider the voltage compliance requirement at the input of the converter. The current input signal has a full-scale value IFS, which may vary as a function of the application. Typically, a current input ΣΔ A/D converter can handle a wide range of full-scale values of the input current, by proper adaptation of its over-digitization frequency $f_S$. In this way the converter circuitry can be designed based on single full-scale input charge, $q_{FS}$, per over-sampling cycle. The value of this charge is typically in the range 0.10–0.15 pC for ΣΔ converters implemented in silicon. The maximum voltage $V_{D,FS}$ applied to the output of the current generator device will be given, in first approximation, by the following equation:

$$V_{D,FS} \approx V_{D,0} + q_{FS}/C_I \qquad (3)$$

The first term of equation (3) represents the value of the voltage in absence of input current (i.e. the input offset voltage of the first converter stage) and the second term represents its increase due to the full-scale input current.

As seen, the typical voltage compliance requirement of a 0-biased photodiode is about ±5 mV and ±25 mV at zero and full-scale current output, respectively. In CAT scanner applications, therefore, the voltage compliance requirement sets a lower limit to the value of the capacitance of $C_I$ at about $q_{FS}/20$ mV, i.e. around 5.0–7.5 pF. As a result, the capacitance of $C_I$ may be about ten times smaller than that of $C_D$, without violating voltage compliance requirements typical of this application.

Examining the additional thermal noise introduced by the flying capacitance $C_I$, any time the flying capacitor $C_I$ disconnects from the capacitive input device, i.e. at the end of phase α of each cycle, a random charge +q remains stored on $C_I$ and an equal and opposite charge –q remains stored on $C_D$. During the following phase β the charge +q is transferred to the feed-back capacitor $C_F$ of the first integrator stage of the converter. When, at the end of phase β, $C_I$ disconnects from the first integrator stage, a new random charge +q' remains stored on $C_I$ and an equal and opposite charge –q' remains stored on the feedback capacitor $C_F$. Therefore, at each cycle, a random noise charge, (+q)+(−q'), is injected at the converter input. Both random charges belong to a distribution whose variance is approximately equal to $KTC_I$, so that the variance of the noise injected at the converter input at each cycle is approximately equal to $2KTC_I$. The opposite random charges stored on $C_I$ and on $C_D$ at the end of the cycle, however, do not dissipate to ground, because there is no path through which they can flow. Rather, during the successive cycles, they redistribute between $C_D$, $C_I$ and $C_F$ and eventually they wind up entirely on $C_F$ and fully compensate the noise charge originally stored on it. This compensation process takes place exponentially, with a time constant that is a function of $C_D$ and $C_I$. In this way, the switching of the flying capacitor $C_I$ generates a noise that disappears in time, i.e. a noise that does not have a DC component or, in other terms, a noise whose spectral density is equal to zero at f=0. An analytical evaluation of the spectral density of the noise power per cycle, $N_{CI}(f)$, due to the switching of $C_I$ can be generated. It is:

$$N_{CI}(f) = (2KTC_I/f_S)[\mu^{-1} - (\mu^{-1}-1)\Sigma_k \mu^k \cos(2\pi k f/f_S)] \qquad (4)$$

In equation (4), $\mu = C_D/(C_I + C_D)$ and the summation variable k spans from 0 to ∞. It is easy to verify that $N_{CI}$ is equal to zero for f=0. In fact it is:

$$N_{CI}(0) = (2KTC_I/f_S)[\mu^{-1} - (\mu^{-1}-1)/(1-\mu)] = 0$$

One can also evaluate the first derivative of $N_{CI}(f)$ and verify that it also is equal to zero for f=0 and, therefore, that the power density of this noise mechanism has a double zero at DC.

For $|f| \ll |f_S|$ equation (4) is well approximated by the following simpler equation:

$$N_{CI}(f) \approx (4\pi^2 KTC_D/f_S)(3 + 2C_D/C_I)(f/f_S)^2 \qquad (5)$$

Equation (5) shows that the spectral density of the noise power per cycle due to the switching of $C_I$ has a parabolic behavior in the frequency region in which $|f| \ll |f_S|$. The low pass filter of the ΣΔ A/D converter passes the frequency components of the band of interest practically unchanged, and drastically attenuates the frequency components that are between the "band of interest" and $\pm f_S/2$. Defining the "band of interest" as the frequency band defined by $|f| \leq |f_S/2\xi|$, where ξ is the over-digitization factor, i.e. the ratio between the converter sampling frequency, $f_S$, and the frequency at which the band of interest is sampled. For sake of simplicity, but without loss of generality, assume that the converter filter has a gain of 1 in the band of interest, i.e. in the frequency interval $|f| \leq |f_S/2\xi|$, and has a gain of 0 in the frequency interval $|f_S/2\xi| < |f| \leq |f_S/2|$. The power per cycle of this noise mechanism, transferred to the converter output, $\sigma_{CI}^2$, will be the integral of the noise power density $N_{CI}(f)$ in the band of interest defined above. It results:

$$\sigma_{CI}^2 \approx (\pi^2 KTC_D/3)(3 + 2C_D/C_I)/\xi^3 \qquad (6)$$

It is convenient to compare the output noise power related to the switching of $C_I$ to the output noise power per cycle, $\sigma_{DAC}^2$, related to the switching of the DAC capacitor $C_{DAC}$ at the input of the converter. In fact, $\sigma_{DAC}^2$ should be the dominant noise source in a well designed ΣΔ A/D converter. Under the same assumption of the behavior of the filter of the converter, it results in:

$$\sigma_{DAC}^2 = 2KTC_{DAC}/\xi \qquad (7)$$

Quantifying the comparison in the specific case of a ΣΔ converter implemented in silicon, which digitized the current output of a detector of a multi-ring CAT scanner.

Reasonable capacitor values for this application are as follows: $C_D=50$ pF, $C_f=7.5$ pF, $C_{DAC}=0.1$ pF.

This results in: $\sigma_{CI}^2 \approx 1.2 \cdot 10^{-29}/\xi^3$ [$C^2$] and $\sigma_{DAC}^2 \approx 9.0 \cdot 10^{-34}/\xi[C^2]$]. These values show that the two noise mechanisms contribute to an equal output noise power at an over-digitization of about 115. At over-digitization values in excess of about 250, which is a lower limit for all practical applications, the output noise power due to the switching of the input flying capacitor is substantially smaller than that related to the switching of the DAC capacitor $C_{DAC}$ of the input stage of the converter.

As shown in FIG. 6.1, the $\Sigma\Delta$ A/D converter can be used in various systems, such as but not limited to a CAT scanner and an electret microphone, indicated generally at 100. Other applications will be self evident to those skilled in the art.

Thus, a new and improved $\Sigma\Delta$ A/D converter constructed in accordance with the present disclosure, and some applications for the converter, have been described. The exemplary embodiment described in this specification have been presented by way of illustration rather than limitation, and various modifications, combinations and substitutions may be effected by those skilled in the art without departure either in spirit or scope from this disclosure in its broader aspects and as set forth in the appended claims.

The $\Sigma\Delta$ A/D converter of the present disclosure as disclosed herein, and all elements thereof, are contained within the scope of at least one of the following claims. No elements of the presently disclosed $\Sigma\Delta$ A/D converter are meant to be disclaimed, nor are they intended to necessarily restrict the interpretation of the claims.

What is claimed is:

1. A sigma delta analog to digital converter of the type adapted to be connected to a capacitive current input device, comprising:
    a sigma delta modulator having an input and an operational amplifier having a gain-bandwidth product; and
    a flying capacitor comprising a charging capacitor and a flying capacitor switch for buffering the input of the sigma delta modulator from the capacitive current input device so that the gain-bandwidth product and power dissipation of the operational amplifier is reduced, wherein the charging capacitor is coupled between the switch and ground, the switch being configured to be electrically switched between a first connection wherein the flying capacitor is electrically connected to an output of the capacitive current input device so that current signal can flow between the capacitive current input device and the charging capacitor, and a second connection wherein the flying capacitor is electrically connected to an input of the sigma delta modulator so that current signal can flow between the charging capacitor and the input of the sigma delta modulator.

2. A sigma delta analog to digital converter according to claim 1, wherein the flying capacitor is configured so as to be alternately switched between the first connection so as to transfer a charge from the capacitive current input device to the charging capacitor and the second connection so as to transfer the charge from the charging capacitor to the input of the sigma delta modulator.

3. A sigma delta analog to digital converter according to claim 2, wherein the sigma delta modulator includes:
    an input stage having an input coupled to the flying capacitor;
    a feedback path;
    a digital to analog converter (DAC) disposed in the feedback path and having a DAC output; and
    a DAC output capacitor and a second switch for alternately switching the DAC output capacitor between a first connection so as to transfer a signal from the output of the digital to analog converter to the DAC output capacitor and a second connection so as to transfer a signal from the DAC output capacitor to The input of the sigma delta modulator.

4. A sigma delta analog to digital converter according to claim 3, wherein The flying capacitor switch and the second switch are each switched at a predetermined frequency between the respective first and second connections.

5. A sigma delta analog to digital converter according to claim 4, wherein the flying capacitor switch and the second switch are switched at the same frequency $f_s$.

6. A sigma delta analog to digital converter according to claim 4, wherein the flying capacitor switch and the second switch are switched at the same frequency $f_s$ so as to define a common switching cycle for both the flying capacitor switch and the second switch, and synchronized so that the flying capacitor switch and the second switch are each switched to the first connection during one phase of the switching cycle and switched to the second connection during a second phase of the switching cycle.

7. A CT scanner including:
    a plurality of capacitive current input devices;
    a sigma delta analog to digital converter (ADC) of the type adapted to be connected to receive current output signal from a capacitive current input device, the sigma delta analog to digital converter comprising:
    a sigma delta modulator having an input and an operational amplifier having a gain bandwidth product; and
    a flying capacitor comprising a charging capacitor and a flying capacitor switch for buffering the input of the sigma delta modulator from a capacitive current input device so tat the gain-bandwidth product and power dissipation of the operational amplifier is reduced, wherein the charging capacitor is coupled between the switch and ground, the flying capacitor switch being configured to be electrically switched between a first connection wherein the flying capacitor is electrically connected to an output of the capacitive current input device so that current signal can flow between the capacitive current input device and the charging capacitor, and a second connection wherein the flying capacitor is electrically connected to an input of the sigma delta modulator so that current signal can flow between the charging capacitor and the input of the sigma delta modulator.

8. A CT scanner according to claim 7, wherein the flying capacitor is configured so as to be alternately switched between the first connection so as to transfer a charge from the capacitive current input device to the charging capacitor and the second connection so as to transfer a charge from the charging capacitor to the input of the sigma delta modulator.

9. A CT scanner according to claim 8, wherein the sigma delta modulator includes:
    an input stage having an input coupled to the flying capacitor;
    a feedback path;
    a digital to analog converter (DAC) disposed in the feedback path and having a DAC output; and
    a DAC output capacitor and a second switch for alternately switching the DAC output capacitor between a first connection so as to transfer a signal from the output of the digital to analog converter to the DAC output capacitor and a second connection so as to transfer a signal from the DAC output capacitor to the input of the sigma delta modulator.

10. A CT scanner according to claim 9, wherein the flying capacitor switch and the second switch are each switched at a predetermined frequency between the respective first and second connections.

11. A CT scanner according to claim 10, wherein the flying capacitor switch and the second switch are switched at the same frequency $f_s$.

12. A CT scanner according to claim 10, wherein the flying capacitor switch and the second switch are switched at the same frequency $f_s$ so as to define a common switching cycle for both the flying capacitor switch and the second switch, and synchronized so that the flying capacitor switch and the second switch are each switched to the first connection during one phase of the switching cycle and switched to the second connection during a second phase of the switching cycle.

13. A method of converting a current provided by a capacitive current input device to a digital signal using a sigma delta analog to digital converter of the type including an input and an operational amplifier having a gain-bandwidth product, the sigma delta analog to digital converter being adapted to be connected to capacitive current input device, comprising:

using a flying capacitor comprising a charging capacitor and a flying capacitor switch for buffering the input of the sigma delta analog to digital converter from the capacitive current input device so that the gain bandwidth product and power dissipation of the operational amplifier is reduced, wherein the charging capacitor is coupled between the switch and ground, the switch being configured to be electrically switched between a first connection wherein the flying capacitor is electrically connected to an output of the capacitive current input device so That a current signal can flow between the capacitive current input device, and a second connection wherein the flying capacitor is electrically connected to an input of the sigma delta modulator so that a current signal can flow between the charging capacitor and the input of the sigma delta modulator.

14. A method according to claim 13, wherein the flying capacitor includes a charging capacitor and a flying capacitor switch, and further comprising alternately switching the flying capacitor switch between the first connection so as to transfer a charge from the capacitive current input device to the charging capacitor and the second connection so as to transfer a charge from the charging capacitor to the input of the sigma delta modulator.

15. A method according to claim 14, wherein the sigma delta modulator includes an input stage having an input coupled to the flying capacitor; a feedback path; a digital to analog converter (DAC) disposed in the feedback path and having a DAC output; and a DAC output capacitor and a second switch, the method further comprising:

alternately switching the DAC output capacitor between a first connection so as to transfer a signal from the output of the digital to analog converter to the DAC output capacitor and a second connection so as to transfer a signal from the DAC output capacitor to the input of the sigma delta modulator.

16. A method according to claim 15, further comprising switching each of the flying capacitor switch and the second switch at a predetermined frequency between the respective first and second connections.

17. A method according to claim 16, further including switching the flying capacitor switch and the second switch the same frequency $f_s$.

18. A method according to claim 16, further including switching the flying capacitor switch and the second switch at the same frequency $f_s$ so as to define a common switching cycle for both the flying capacitor switch and the second switch, and synchronizing the switching of the flying capacitor and the second switch so that the flying capacitor switch and the second switch are each switched to the first connection during one phase of the switching cycle and switched to the second connection during a second phase of the switching cycle.

* * * * *

UNITED STATES PATENT AND TRADEMARK OFFICE
CERTIFICATE OF CORRECTION

PATENT NO.        : 7,230,555 B2                                      Page 1 of 1
APPLICATION NO. : 11/064161
DATED             : June 12, 2007
INVENTOR(S)       : Enrico Dolazza et al.

It is certified that error appears in the above-identified patent and that said Letters Patent is hereby corrected as shown below:

IN THE CLAIMS:

Column 8, line 15, delete "$f_5$" and replace with "$f_s$".
Column 8, line 17, delete "$f_5$" and replace with "$f_s$".
Column 8, line 35, delete "tat" and replace with "that".
Column 9, line 5, delete "frequency" and replace with "frequency".
Column 9, line 9, delete "$f_5$" and replace with "$f_s$".
Column 9, line 12, delete "$f_5$" and replace with "$f_s$".
Column 10, line 29, delete "$f_5$" and replace with "$f_s$".
Column 10, line 32, delete "$f_5$" and replace with "$f_s$".

Signed and Sealed this

Third Day of November, 2009

David J. Kappos
*Director of the United States Patent and Trademark Office*